(12) United States Patent
Han et al.

(10) Patent No.: US 10,698,024 B1
(45) Date of Patent: Jun. 30, 2020

(54) SELF-HEALING MICROCHIP

(71) Applicant: UNITED STATES OF AMERICA AS REPRESENTED BY THE ADMINISTRATOR OF NASA, Washington, DC (US)

(72) Inventors: Jin-Woo Han, San Jose, CA (US); Meyya Meyyappan, San Jose, CA (US)

(73) Assignee: United States of America as Represented by the Administrator of NASA, Washington, DC (US)

( * ) Notice: Subject to any disclaimer, the term of this patent is extended or adjusted under 35 U.S.C. 154(b) by 212 days.

(21) Appl. No.: 15/916,174

(22) Filed: Mar. 8, 2018

Related U.S. Application Data

(60) Provisional application No. 62/560,519, filed on Sep. 19, 2017.

(51) Int. Cl.
*G01R 31/10* (2006.01)
*G01R 31/28* (2006.01)
(Continued)

(52) U.S. Cl.
CPC ..... *G01R 31/2856* (2013.01); *G01R 31/2644* (2013.01); *G01R 31/2863* (2013.01);
(Continued)

(58) Field of Classification Search
CPC ......... H01L 2924/00; H01L 2924/0002; H01L 2224/16; H01L 2224/48247;
(Continued)

(56) References Cited

U.S. PATENT DOCUMENTS

2012/0065937 A1* 3/2012 de Graff ................ G01D 9/005
702/187
2014/0221812 A1* 8/2014 Heismann .............. A61B 5/055
600/407

(Continued)

OTHER PUBLICATIONS

Han, Jin-Woo; Kebaili, Mo; and Meyyappan; M., "System on Microheater for On-Chip Annealing of Defects Generated by Hot-Carrier Injection, Bias Temperature Instability, and Ionizing Radiation," IEEE Electron Device Letters, vol. 37, No. 12, Dec. 2016, pp. 1543-1546.

(Continued)

*Primary Examiner* — Raul J Rios Russo
(74) *Attorney, Agent, or Firm* — Rhys W. Cheung; Robert M. Padilla

(57) ABSTRACT

A self-healing microchip comprising a commercial-off-the-shelf (COTS) microchip lacking radiation shielding. The self-healing microchip includes one or more microheaters that are integrated directly upon a surface of the COTS microchip, a self-test circuit which detects a degradation in the COTS microchip, and one or more temperature sensors. The one or more microheaters may be formed directly upon a backside surface of the COTS microchip using tungsten sputtered shadow mask patterning or by lithography and etching, for example. In response to a detected degradation in the COTS microchip, a temperature control configures an output temperature generated by the one or more microheaters and an amount of time at which the output temperature is maintained to cause annealing in the microchip responsive to the detected degradation in the COTS microchip.

20 Claims, 3 Drawing Sheets

(51) Int. Cl.
*H01L 23/34* (2006.01)
*G01R 31/26* (2020.01)

(52) U.S. Cl.
CPC ..... *G01R 31/2874* (2013.01); *G01R 31/2875* (2013.01); *H01L 23/345* (2013.01); *H01L 2224/16* (2013.01); *H01L 2224/48247* (2013.01); *H01L 2924/00* (2013.01); *H01L 2924/0002* (2013.01)

(58) Field of Classification Search
CPC ............ G01R 31/2874; G01R 31/2875; G01R 31/2856; G01R 31/2863; G01R 31/287
USPC ......... 324/71, 378, 403, 415, 425, 500, 537, 324/750.01, 750.03, 750.05, 7, 50.06
See application file for complete search history.

(56) References Cited

U.S. PATENT DOCUMENTS

| | | | |
|---|---|---|---|
| 2015/0339505 A1* | 11/2015 | Kidd | G06K 7/10821 235/440 |
| 2016/0050750 A1* | 2/2016 | Rogers | H05K 1/0286 361/767 |
| 2016/0124041 A1* | 5/2016 | Pathak | G01R 29/08 324/629 |
| 2018/0128760 A1* | 5/2018 | Karpov | G01N 25/32 |

OTHER PUBLICATIONS

Han, Jin-Woo; Peterson, Ricardo; Moon, Dong-Il; Senesky, Debbie G.; Meyyappan, M., "Monolithically Integrated Microheater for On-Chip Annealing of Oxide Defects," IEEE Electron Device Letters, vol. 38, No. 7, Jul. 2017, pp. 831-834.

* cited by examiner

SELF-HEALING MICROCHIP

CROSS-REFERENCE TO RELATED APPLICATION

This application claims the benefit of U.S. Provisional Application No. 62/560,519, filed Sep. 19, 2017, which is hereby incorporated by reference in its entirety.

ORIGIN OF THE INVENTION

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor has elected not to retain title.

FIELD OF THE INVENTION

Embodiments of the invention generally relate to the field of integrated circuits, and more particularly, to approaches for recovering from degradation in an integrated circuit.

DESCRIPTION OF THE PRIOR ART

Computer equipment often must be deployed in environments which are not conducive to the long term operational health of that equipment. For example, computer equipment often needs to operate in radiation-rich environments. Deep space harbors many sources of radiation, such as cosmic rays and solar wind. Manned or unmanned spacecraft, and any space bound computer equipment, typically combats the high levels of radiation in space by way of employing radiation shielding, despite the high costs of doing so, not only in financial terms but also in labor and the additional complexity involved in bringing additional weight from the surface of a planet into space.

At high altitudes and at low Earth orbit (LEO), radiation levels are higher than those at Earth's surface. For this reason, computer equipment found in airplanes, rockets, weather balloons, and the numerous types of satellites orbiting the planet all experience increased amounts of radiation. Even at the surface, it is quite common for computer equipment to be routinely exposed to large amounts of radiation. Computer equipment found in hospitals and dentist offices often deals directly with, or operates in close proximity of, x-rays and radiation in the course of therapy and treatment. Other examples of where computer equipment may be found near radiation sources include nuclear reactors, natural gas drilling, and certain industrial activities such as welding.

Over time, radiation will cause undesired changes in electronic circuits, eventually rendering them completely inoperable. Radiation may cause a buildup of localized charge within semiconductor and insulating materials within a microchip, which alters local field distribution, threshold voltage, and leakage current.

The defects induced into a microchip as a result of exposure to radiation can be recovered from by heating the microchip (i.e., annealing the microchip). By annealing a microchip, defects in the microchip, such as missing atoms in the lattice, charge traps, and dangling bonds may be recovered. Annealing can recovery from defects introduced into a microchip not only from radiation exposure, but also from use over time, i.e., aging.

Annealing has been used to cure deficiencies at the transistor level. Such transistor level annealing involved dual contact pads situated on the gate to allow current to flow, thereby creating heat for the annealing process. However, as might be expected, transistor level annealing requires modification of the circuit design to accommodate the annealing, which increases the area overhead of the circuit design and the financial cost in obtaining such circuits. Annealing of a microchip has also been performed by manufacturing the microchip and a microheater separately, and thereafter, combining the separately fabricated components together in a single package in a stacked arrangement.

SUMMARY OF THE INVENTION

Embodiments of the invention are directed towards self-healing electronics which are capable of recovering from (i.e., "healing") degradation in the electronics originating from a variety of sources, including radiation exposure and aging. As such, embodiments of the invention have particular utility in operational environments having increased levels of radiation exposure, such as space, aircraft at altitude, rocketry, weather balloons, hospitals, industrial applications such as welding, and medical and dental offices, to name but a few examples.

The prior art approach of performing annealing of a microchip by manufacturing the microchip and a microheater separately, and thereafter, combining the separately fabricated components together in a single package in a stacked arrangement has been discovered to lead to a variety of disadvantages. The creation of a stacked arrangement of this nature leads to increased process cost and complexity. Additionally, the use of a stacked arrangement increases the die profile, which accordingly increases the power consumed during the annealing due to increased heat capacitance. Further, the adhesive layer used in combining the separately manufactured components in the stacked arrangement degrades over time at high temperature, e.g., the temperature tolerance of a polyimide adhesive layer used in forming the stacked arrangement is approximately 300° Celsius, which will likely constrain the effectiveness of the annealing process, which typically requires a temperature in the range of 150-500° Celsius, with 400° Celsius being typical of an embodiment.

Advantageously, embodiments of the invention provide for a self-healing microchip that overcomes the disadvantages of the prior art. The self-healing microchip of an embodiment includes one or more microheaters that are integrated directly upon a surface of a commercial-off-the-shelf (COTS) microchip. Tungsten sputtered shadow mask patterning may, but need not, be used to integrate a microheater upon the COTS microchip. As another example of how a microheater may be directly integrated upon the COTS microchip, material composing the microheater may be an arbitrary metal or conductive polysilicon, and the patterning may be accomplished via lithography and etching. The one or more microheaters may be directly integrated upon a backside of the COTS microchip which may, but need not, be thinned prior to the microheaters being directly integrated thereon. A self-test circuit that detects a degradation in the COTS microchip may be integrated on the COTS microchip or may be reside external to, but in communication with, the COTS microchip. The COTS microchip will also possess one or more temperature sensors which are used in a feedback loop with a temperature control during the annealing process to ensure accurate heating of the COTS microchip.

In response to a detected degradation in the COTS microchip, the self-test circuit determines an output temperature to be generated by the one or more microheaters and an amount of time at which the output temperature is maintained to cause annealing in the microchip proportionate to the detected degradation in the COTS microchip. Thereafter, the self-test circuit commutates the determined information to the temperature control, which in turn causes the one or more mircoheaters to generate and maintain the determined output temperature for the determined amount of time. The temperature control may be integrated on the COTS microchip itself or may reside external to, but in communication with, the COTS microchip.

Numerous other aspects of embodiments of the invention shall be discussed in greater detail below.

BRIEF DESCRIPTION OF THE DRAWINGS

Embodiments of the invention are illustrated by way of example, and not by way of limitation, in the figures of the accompanying drawings and in which like reference numerals refer to similar elements and in which.

DETAILED DESCRIPTION OF THE INVENTION

Approaches for a self-healing microchip are presented herein. In the following description, numerous specific details are set forth in order to provide a thorough understanding of the embodiments of the invention described herein. It will be apparent, however, that the embodiments of the invention described herein may be practiced without these specific details. In other instances, well-known structures and devices are shown in block diagram form or discussed at a high level in order to avoid unnecessarily obscuring teachings of embodiments of the invention.

FUNCTIONAL OVERVIEW

Over time, microchips tend to degrade due to stress induced leakage current (SILC), hot-carrier injection (HCI), and bias temperature instability (BTI). In addition, total ionizing dose (TID) degradation caused by ionizing radiations is an issue in microchips deployed in space and other high radiation environments. Particularly, TID has become an obstacle for space exploration beyond 20 years. These wear out mechanisms collectively limit the stability and lifetime of microchips.

If the degradation in microchips can be corrected, or healed, during the life of microchip, then the reliability and lifetime of that microchip can be improved. To that end, embodiments of the invention are directed towards identifying degradation in microchips, and once identified, using an annealing process to heal the microchip to correct the degradation.

Embodiments may be used to improve the recovery of a Metal-Oxide-semiconductor transistor that has been exposed to a radiation pulse or a continuous exposure to radiation. Regardless of the type of degradation mechanism, the results of SILC, HCI, BTI, and TID appear as bulk-trapped charges. These process-induced defects include missing atoms in the lattice, charge traps, and dangling bond. Such defects may all be recovered by thermal treatment, i.e., annealing via the application of heat in the range of 150–500° Celsius.

SYSTEM OVERVIEW

Figure 1:
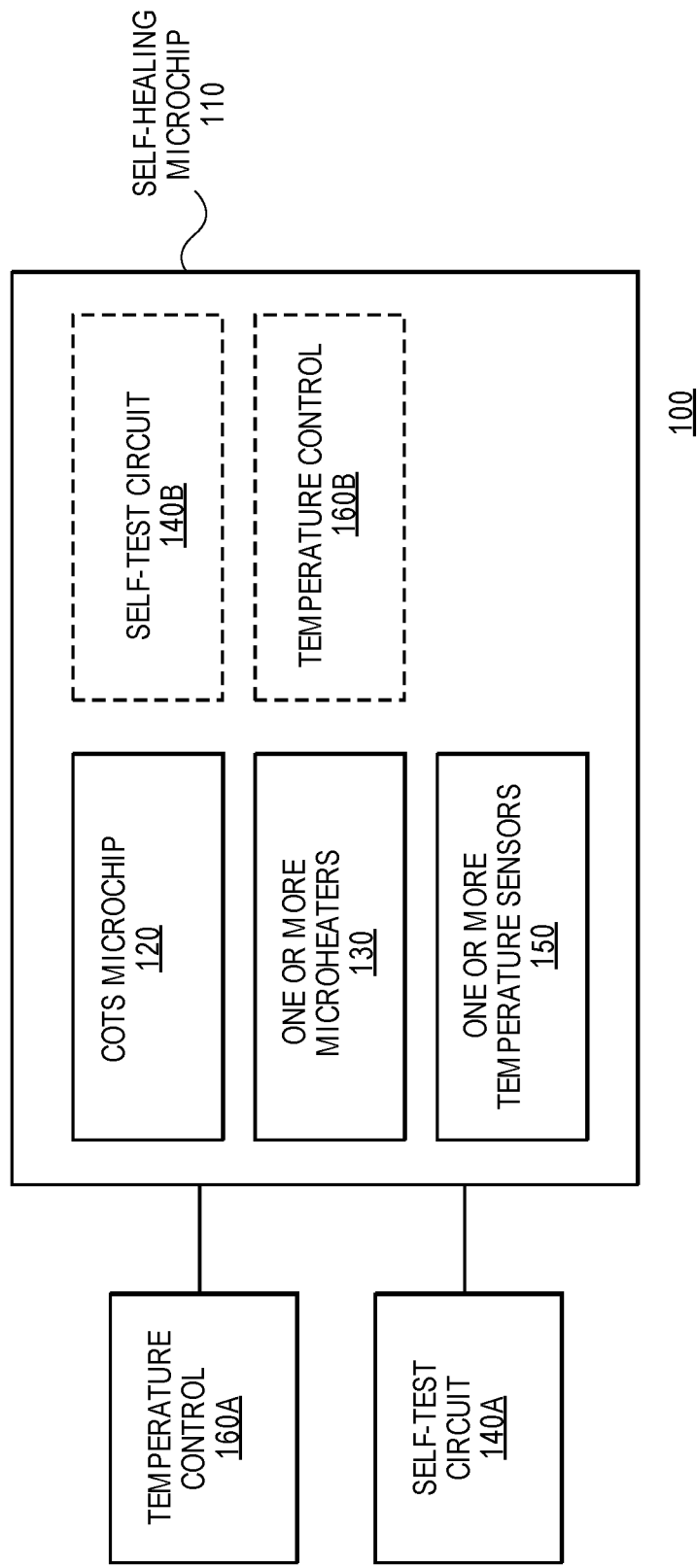
FIG. 1 is a block diagram illustrating functional components of a self-healing microchip according to an embodiment of the invention.

FIG. 1 is a block diagram illustrating functional components of a system 100 for a self-healing microchip 110 according to an embodiment of the invention. Self-healing microchip 110, as broadly used herein, represents a microchip which is capable of recovering from a variety of different types of degradation, notably those typically associated with radiation and aging. Self-healing microchip 110 may, but need not, be enclosed within or protected by radiation shielding to recover from degradation due to radiation and aging.

As shown in FIG. 1, self-healing microchip 110 is composed of a variety of functional components, namely commercial-off-the-shelf (COTS) microchip 120, one or more microheaters 130, and one or more temperature sensors 150. As shown in FIG. 1, certain functional components of system 100, such as a temperature control and a self-test circuit, may be implemented either directly upon COTS microchip 120 as part of self-healing microchip 110 or may be implemented external to self-healing microchip 110.

COTS microchip 120, as broadly used herein, represents an arbitrary commercial-off-the-shelf (COTS) microchip. In an embodiment, COTS microchip 120 may be a Complementary Metal-Oxide Semiconductor (CMOS) microchip. COTS microchip 120 may also be a Very-Large-Scale Integration (VLCI) microchip. Note that COTS microchip 120 may be obtained directly from a commercial supplier of microchips, and so COTS microchip 120 may, but certainly need not, have any customizations related to the process of recovering from degradation due to aging and/or radiation. COTS microchip 120 need not possess lacking radiation shielding or be radiation hardened.

One or more microheaters 130, as broadly used herein, represent any mechanism for heating COTS microchip 120, or a portion thereof, in a controlled manner. Non-limiting, illustrative examples of a microheater 130 include a thermistor, a thermotransistor, a thermodiode, and a thermocouple. In an embodiment, one or more microheaters 130 may be composed, at least in part, of arbitrary metal or conductive polysilicon. As shall be explained in greater detail below, the supply voltage provided to the microheaters may be adaptively adjusted through a positive feedback loop across the one or more temperature sensors 150 and a self-test circuit.

A self-test circuit may reside on self-healing microchip 110 (depicted in FIG. 1 as self-test circuit 140B) or may be implemented external to self-healing microchip 110 (depicted in FIG. 1 as self-test circuit 140A). Self-test circuit 140 shall be used herein to refer to either self-test circuit 140A or self-test circuit 140B.

Self-test circuit 140 may examine and monitor certain parameters of COTS microchip 120 to identify a degradation of COTS microchip 120, and by extension, predict its failure. Self-test circuit 140 may periodically diagnose a shift of parameters of COTS microchip 120, e.g., self-test circuit 140 may monitor the shift of $V_T$ timing or other parameters relevant to wear-out mechanisms. As another example, self-test circuit 140 may examine the gate oxide reliability of COTS microchip 120 and predicts its failure. Self-test circuit 140 may monitor the extent of degradation in COTS microchip 120 during its lifetime and during the annealing process to determine when to initiate and cease the annealing process.

One or more temperature sensors 150, as broadly used herein, refer to any mechanism for monitoring the temperature of COTS microchip 120 or a portion thereof. Non-limiting, illustrative examples of a temperature sensor 150 include a thermistor, a thermotransistor, a thermodiode, and a thermocouple. The temperature of COTS microchip 120 measured by one or more temperature sensors 150 may be provided to self-test circuit 140 and/or temperature control 160 to enable that entity to monitor how the annealing process is proceeding and adjust accordingly.

A temperature control may reside on self-healing microchip 110 (depicted in FIG. 1 as temperature control 160B) or may be implemented external to self-healing microchip 110 (depicted in FIG. 1 as temperature control 160A). Temperature control 160 shall be used herein to refer to either temperature control 160A or temperature control 160B.

Temperature control 160 is a mechanism for controlling the operation of one or more microheaters 130. Temperature control 160 thus controls the output temperature produced by one or more microheaters 130 as well as how long the output temperature is maintained by each microheater.

In an embodiment, temperature control 160 may control each of the one or more microheaters 130 separately. Such an embodiment may be employed when it is desirable to perform the annealing process on a portion, or region, of COTS microchip 120 in which a particular degradation has been detected. In this way, temperature control 160 can cause one a subset of the microheaters 130 to perform an annealing process on a particular region of COTS microchip 120 (i.e., the region in which a degradation has been detected), but not cause other microheaters 130 outside of that region to generate heat where no degradation has yet been detected.

After having describing various functional components of system 100, additional description will now be provided for creating system 100 for a self-healing microchip 110.

Creating a Self-Healing Microchip

Figure 2:
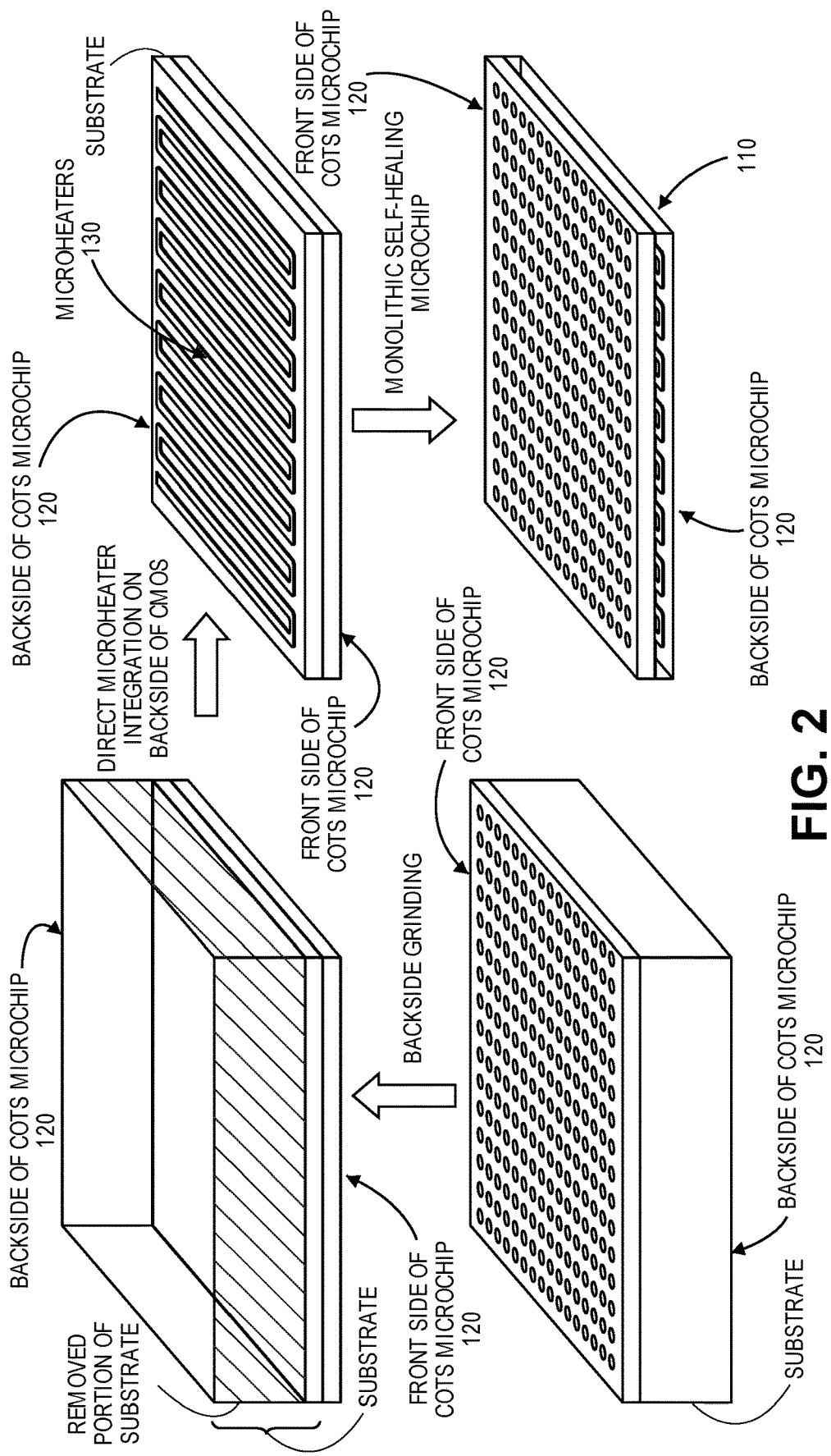
FIG. 2 is an illustration of directly integrating one or more microheaters upon the backside of a commercial-off-the-shelf (COTS) microchip according to an embodiment of the invention.

FIG. 2 is an illustration of directly integrating one or more microheaters 130 upon the backside of a commercial-off-the-shelf (COTS) microchip 120 according to an embodiment of the invention. FIG. 2 shall be discussed below with reference to FIG. 3, which is a flowchart illustrating the steps of creating a self-healing microchip according to an embodiment of the invention. While FIG. 2 and FIG. 3 each depict a sequence of steps, embodiments of the invention may perform the steps of FIG. 2 and/or FIG. 3 in any order or in parallel.

Figure 3:
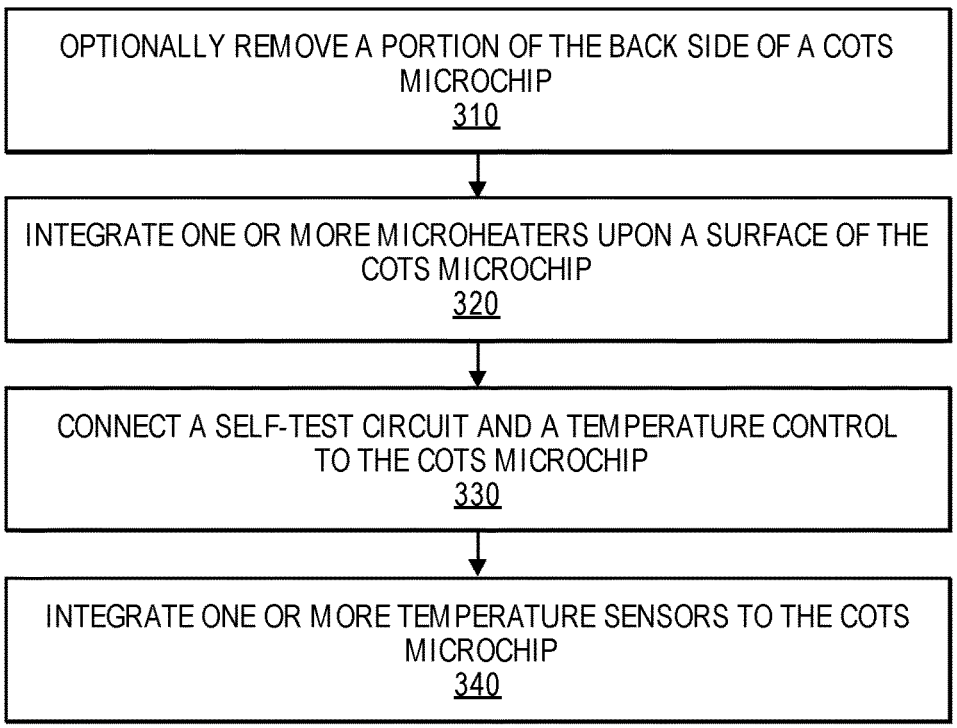
FIG. 3 is a flowchart illustrating the steps of creating a self-healing microchip according to an embodiment of the invention.

In step 310 of FIG. 3, a portion of the backside of COTS microchip 120 is removed. The removed portion will correspond to a portion of the substrate of COTS microchip 120 and may be removed by grinding, for example. Note that step 310 is an optional step; consequently, certain embodiments of the invention may not perform step 310. The purpose of removing a portion of the backside of COTS microchip 120 is to reduce its heat capacity.

Step 310 may be performed as shown in FIG. 2. As a non-limiting, illustrative example, the microchip shown in FIG. 2 is sized 2×2 mm$^2$ and was thinned down to 30 μm to reduce heat capacity.

In step 320 of FIG. 3, one or more microheaters 130 are integrated directly upon the backside surface of COTS microchip 120. As the fabrication of one or more microheaters 130 is independent from the front side circuitry of COTS microchip 120, any arbitrary commercial-off-the-shelf microchip may be used as COTS microchip 120.

One or more microheaters 130 may be fabricated on a polyimide substrate corresponding to the backside of COTS microchip 120, as shown in FIG. 2. One or more microheaters 130 may be integrated directly upon a backside surface of COTS microchip 120 using tungsten sputtered shadow mask patterning. Alternately, one or more microheaters 130 may be composed, at least in part, of arbitrary metal or conductive polysilicon and may be directly integrated upon COTS microchip 120 using patterning accomplished via lithography and etching.

One or more microheaters 130 may have a variety of different sizes and forms. As one example, a microheater 130 may be implemented to have an active size of 2×4 mm$^2$. One or more microheaters 130 may also be implemented using a distributed local microheater array to deal with a spatially non-uniform degradation across COTS microchip 120.

In step 330, self-test circuit 140 and temperature control 160 are coupled to COTS microchip 120. Self-test circuit 140 and temperature control 160 may each be implemented upon self-healing microchip 110 or within the larger computerized environment in which self-healing microchip 110 inhabits, so long as self-test circuit 140 and temperature control 160 remain in communication with self-healing microchip 110.

In certain embodiments, self-test circuit 140 and temperature control 160 may reside external to self-healing microchip 110 and may communicate with a plurality of different self-healing microchips 110. In this way, a single self-test circuit 140 and/or a single temperature control 160 may operate in conjunction with a plurality of self-healing microchips 110.

In step 340, one or more temperature sensors 150 are integrated upon COTS microchip 120. In an embodiment, the one or more temperature sensors 150 are dispersed uniformly over the backside surface of COTS microchip 120.

Maintaining a Self-Healing Microchip

Figure 4:
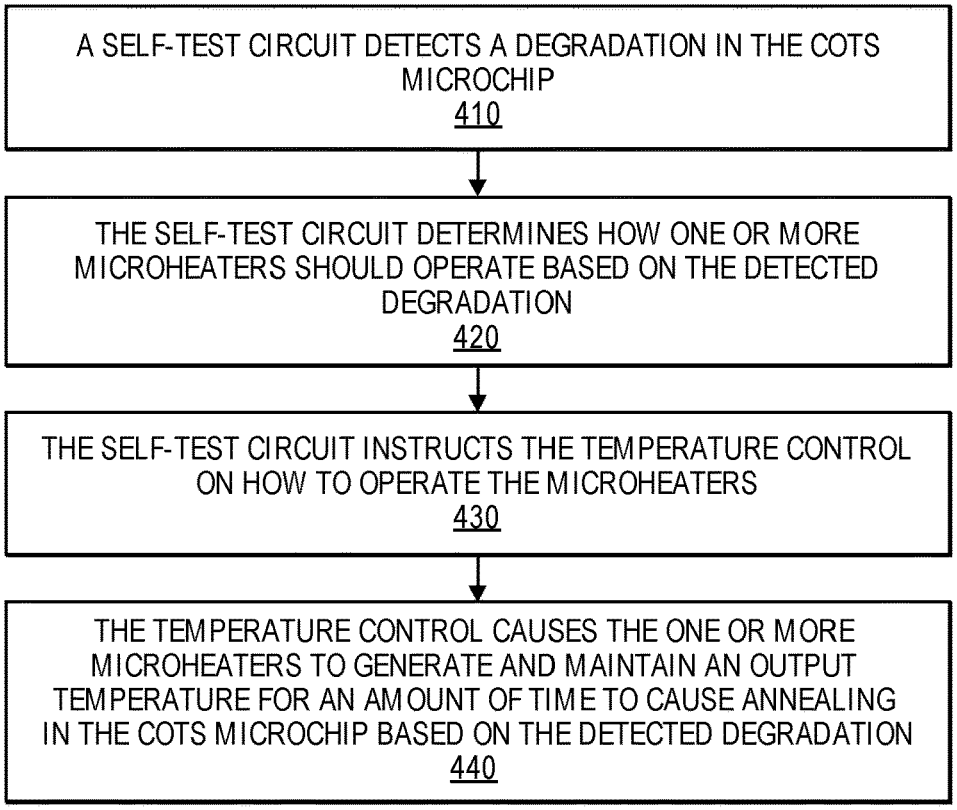
FIG. 4 is a flowchart illustrating the steps of maintaining a self-healing microchip according to an embodiment of the invention.

FIG. 4 is a flowchart illustrating the steps of maintaining a self-healing microchip 110 according to an embodiment of the invention. While FIG. 4 depicts a sequence of steps, embodiments of the invention may perform the steps of FIG. 4 in any order or in parallel.

Note that self-test circuit 140 may continuously monitor or periodically at regular or scheduled intervals evaluate the health of COTS microchip 120. As self-test circuit 140 monitors the health and operational parameters of COTS microchip 120, upon inquiry by other computerized components or at predetermined intervals, self-test circuit 140 may generate and provide an estimate of a present amount of degradation in COTS microchip 120.

In step 410, self-test circuit 140 detects a degradation in COTS microchip 120. The degradation in COTS microchip 120 detected by self-test circuit 140 may be the result of radiation exposure and/or aging of COTS microchip 120. As an example, the degradation in COTS microchip 120 may result from one or more of stress induced leakage current, hot-carrier injection, bias temperature instability, and total ionizing dose.

The detection condition constituting the degradation in step 410 may include bulk-trapped charges and interface states in gate dielectric and field oxide of COTS microchip 120. Self-test circuit 140, in step 410, will examine gate oxide reliability and predict failure thereof in COTS microchip 120.

In an optional embodiment, the degradation detected in step 410 may be localized to a particular region of COTS microchip 120. In such an embodiment, self-test circuit 140 may note this information and subsequently perform the annealing process only in that particular region.

In step 420, self-test circuit 140 determines how one or more microheaters 130 should operate based on the degradation detected in step 410. Such a determination includes what temperature (the "output temperature") the one or more microheaters 130 should generate and how long those one or more microheaters 130 should maintain that output temperature. If the degradation detected in step 410 is localized to a particular region of COTS microchip 120, self-test circuit 140 may further determine only a subset of microheaters 130 in that region should perform the annealing process.

In step 430, self-test circuit 140 instructs temperature control 160 on how to operate one or more microheaters 130.

In step 440, temperature control 160 causes one or more microheaters 130 to generate and maintain an output temperature for an amount of time to cause annealing in the COTS microchip 120 based on the detected degradation. The heat required for the annealing process, and the length of time at which the heat is maintained, will be responsive to the detected degradation of COTS microchip 110. To illustrate, the output temperature generated by one or more microheaters 130 may correspond to a temperature in the range of 150-500° Celsius, for example.

During the annealing process performed in step 440, all circuits in the COTS microchip 120 are unbiased in order to avoid high-temperature induced leakage, bias temperature instability (BTI) stress, and malfunction. After performing step 440, the degradation in COTS microchip 120 may be recovered from, thereby extending its operational lifetime.

Embodiments of the invention enable the recovery from degradation in the electronics originating from a variety of sources, such as radiation exposure and aging. As such, embodiments of the invention have particular utility in operational environments having increased levels of radiation exposure, such as space, aircraft at altitude, rocketry, weather balloons, hospitals, industrial applications such as welding, and medical and dental offices, to name but a few examples.

In particular, embodiments of the invention have particular utility in commercial and government activity in space, as microchips are fundamental building blocks of any commercial or government satellite, vehicle, space station, robot, and rover. Nuclear power and propulsion, as well as long duration space missions, require long-life and high durability of any associated computerized components. Not only will self-healing microchips of an embodiment enhance the robustness of space deployed electronics, the resulting weight loss from a reduced amount of radiation shielding translates to a reduced payload weight, and by extension, reduced launching costs.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A self-healing microchip, comprising:
   a commercial-off-the-shelf (COTS) microchip lacking radiation shielding;
   one or more microheaters integrated directly upon a surface of said COTS microchip;
   one or more temperature sensors coupled to said COTS microchip;
   a self-test circuit which detects a degradation in said COTS microchip; and
   a temperature control for configuring (a) an output temperature generated by said one or more microheaters and (b) an amount of time at which said output temperature is maintained, wherein said output temperature and said amount of time are selected by said temperature control to cause annealing in said microchip proportionate to said detected degradation in said COTS microchip.

2. The self-healing microchip of claim 1, wherein said COTS microchip is one or more of a Complementary Metal-Oxide Semiconductor (CMOS) microchip and a Very-Large-Scale Integration (VLCI) microchip.

3. The self-healing microchip of claim 1, wherein said degradation in said COTS microchip includes bulk-trapped charges and interface states in gate dielectric and field oxide.

4. The self-healing microchip of claim 1, wherein said degradation results from one or more of stress induced leakage current, hot-carrier injection, bias temperature instability, and total ionizing dose.

5. The self-healing microchip of claim 1, wherein said one or more microheaters are integrated directly upon a backside surface of said COTS microchip using tungsten sputtered shadow mask patterning or using lithography and etching.

6. The self-healing microchip of claim 1, wherein said output temperature generated by said one or more microheaters is between 150-500° Celsius.

7. The self-healing microchip of claim 1, wherein said self-test circuit is configured to examine gate oxide reliability and predict failure of said COTS microchip.

8. The self-healing microchip of claim 1, wherein said self-test circuit is configured to monitor said COTS microchip and generate an estimate of a present amount of degradation of said COTS microchip.

9. The self-healing microchip of claim 1, wherein said self-healing microchip is not enclosed within or protected by radiation shielding, and wherein said COTS microchip is not radiation hardened.

10. The self-healing microchip of claim 1, wherein said self-test circuit detects said degradation in a particular region of a plurality of regions covering said surface of said COTS microchip, and wherein said temperature control configures a particular output temperature of a particular microheater, of said one or more microheaters, associated with said particular region to cause annealing in said particular region of said COTS microchip proportionate to said detected degradation in said particular region of said COTS microchip.

11. A method of manufacturing a self-healing microchip, comprising:
  integrating one or more microheaters directly upon a surface of a commercial-off-the-shelf (COTS) microchip lacking radiation shielding;
  coupling, to said COTS microchip, a self-test circuit that detects a degradation in said COTS microchip; and
  coupling, to said COTS microchip, one or more temperature sensors for detecting a temperature in one or more locations of said COTS microchip,
  wherein said one or more microheaters are each configured to generate and maintain an output temperature for an amount of time to cause annealing in said COTS microchip proportionate to said detected degradation in said COTS microchip, and wherein said output temperature and said amount of time are determined by a temperature control and communicated to said one or more microheaters thereby.

12. The method of manufacturing a self-healing microchip of claim 11, wherein integrating the one or more microheaters upon a surface of the COTS microchip comprises:
  forming the one or more microheaters directly upon a backside surface of the COTS microchip using tungsten sputtered shadow mask patterning or using lithography and etching.

13. The method of manufacturing a self-healing microchip of claim 11, wherein integrating the one or more microheaters upon a surface of the COTS microchip comprises:
  prior to integrating the one or more microheaters upon said surface, grinding said surface of said COTS microchip to remove excess substrate from a backside of the COTS microchip.

14. A method of maintaining a self-healing microchip, comprising:
  a self-test circuit, coupled to a commercial-off-the-shelf (COTS) microchip lacking radiation shielding, which detects a degradation in said COTS microchip;
  one or more microheaters integrated directly upon a surface of said COTS microchip receiving instruction from a temperature control; and
  in response to receiving said instruction, the one or more microheaters generating and maintaining an output temperature for an amount of time to cause annealing in said COTS microchip proportionate to said detected degradation in said COTS microchip, wherein said output temperature and said amount of time are identified by said instruction.

15. The method of claim 14, wherein said degradation detected by said self-test circuit comprises degradation due to one or more of stress induced leakage current, hot-carrier injection, bias temperature instability, and total ionizing dose.

16. The method of claim 14, further comprising:
  the self-test circuit continuously monitoring an extent of degradation by diagnosing a shift of operational parameters of said COTS microchip.

17. The method of claim 14, further comprising:
  the self-test circuit continuously monitoring an extent of degradation by examining gate oxide reliability.

18. The method of claim 14, wherein execution of the one or more sequences of instructions further cause:
  upon said self-test circuit detecting said degradation in a particular region of a plurality of regions covering said surface of said COTS microchip, said temperature control instructing a particular microheater, of said one or more microheaters, associated with said particular region to generate and maintain a particular temperature for a particular amount of time to cause annealing in said particular region of said COTS microchip proportionate to said detected degradation in said particular region of said COTS microchip.

19. The method of claim 14, wherein said one or more microheaters correspond to one or more of: a thermistor, a thermotransistor, a thermodiode, and a thermocouple.

20. The method of claim 14, wherein said degradation is caused by radiation exposure during deploying of said self-healing chip in outer space.

* * * * *